United States Patent
Hwan

(10) Patent No.: US 8,344,734 B2
(45) Date of Patent: Jan. 1, 2013

(54) TEST MODULE FOR RADIO FREQUENCY IDENTIFICATION CHIPS AND METHOD OF THE SAME

(75) Inventor: Lu-Chen Hwan, Taipei (TW)

(73) Assignee: Mutual-Pak Technology Co., Ltd., Taipei County, Xinzhuang (TW)

( * ) Notice: Subject to any disclaimer, the term of this patent is extended or adjusted under 35 U.S.C. 154(b) by 446 days.

(21) Appl. No.: 12/574,372

(22) Filed: Oct. 6, 2009

(65) Prior Publication Data

US 2010/0090707 A1 Apr. 15, 2010

(30) Foreign Application Priority Data

Oct. 9, 2008 (TW) .............................. 97138960 A

(51) Int. Cl.
*G01R 31/02* (2006.01)
(52) U.S. Cl. ................. 324/537; 324/750.3; 324/754.31
(58) Field of Classification Search .................... 324/537
See application file for complete search history.

(56) References Cited

U.S. PATENT DOCUMENTS

| | | | | |
|---|---|---|---|---|
| 5,975,915 | A * | 11/1999 | Yamazaki et al. | 439/72 |
| 6,183,272 | B1 * | 2/2001 | Muller et al. | 439/91 |
| 6,236,223 | B1 * | 5/2001 | Brady et al. | 324/750.3 |
| 7,238,037 | B2 * | 7/2007 | Chen | 439/247 |
| 2002/0053735 | A1 * | 5/2002 | Neuhaus et al. | 257/728 |
| 2007/0046433 | A1 * | 3/2007 | Mukherjee | 340/10.1 |

FOREIGN PATENT DOCUMENTS

| | | |
|---|---|---|
| JP | 2007-310459 A | 11/2007 |
| TW | 529805 | 4/2003 |
| TW | M242915 | 9/2004 |

OTHER PUBLICATIONS

Dainippon Printing, JP 2007-310459, Machine Translation by JPO, p. 1-34.*

* cited by examiner

*Primary Examiner* — Thomas Valone
(74) *Attorney, Agent, or Firm* — Snell & Wilmer L.L.P.

(57) ABSTRACT

A test module and method for radio frequency identification (RFID) chips are provided. The test module includes a test head having a chip carrier for carrying a RFID chip to be tested, the chip carrier having a first antenna electronically connecting the RFID chip. The module further includes a second antenna for communicating with the first antenna; and a base supporting the chip carrier and the second antenna. The test module further includes a test computer electronically connecting the second antenna, wherein the test computer evaluates functions of the RFID chip by way of the communications between the first antenna and the second antenna.

6 Claims, 4 Drawing Sheets

TEST MODULE FOR RADIO FREQUENCY IDENTIFICATION CHIPS AND METHOD OF THE SAME

CROSS REFERENCE TO RELATED APPLICATIONS

This application claims the right of priority based on Taiwan Patent Application No. 97138960 entitled "TEST MODULE FOR RADIO FREQUENCY IDENTIFICATION CHIPS AND METHOD OF THE SAME," filed on Oct. 9, 2008, which is incorporated herein by reference and assigned to the assignee herein.

FIELD OF THE INVENTION

This invention relates to a test module for integrated circuits and a method of the same, and more particularly relates to an integrated circuit test system employing a radio frequency identification system (RFID system).

BACKGROUND OF THE INVENTION

In the recent years, the RFID system has played an important role in shipping and logistic applications. In general, the RFID system typically includes an integrated circuit and an RFID component connected to antennas of the integrated circuit. The RFID system also includes a read/write machine, which provides RF carrier wave to power the RFID component. Through the RF carrier wave, the read/write machine and the RFID component can exchanges data without physical contact.

During manufacturing of the RFID elements, various function tests must be performed thereon. However, currently available test systems are only suitable for integrated circuits on an uncut wafer, not being suitable for individual integrated circuit chips divided from the wafer. This is a practical disadvantage, as the current test system cannot avoid the risk of integrated circuit damage during the cutting process. In addition, the test systems are very expensive. Accordingly, a test module suitable for cut RFID chips and a method of the same are desirable.

SUMMARY OF THE INVENTION

In view of this, a test module having antennas that simulate the RFID working system is disclosed. Individual RFID chips are transferred to such a test module and tested thereby. In doing so, there is no need to perform function test of integrated circuits on the wafer before the cutting process.

In one embodiment of the invention, a test module for radio frequency identification (RFID) chips is provided, comprising:
  a chip carrier for carrying a RFID chip to be tested, the chip carrier having a first antenna for electronically connecting to the RFID chip;
  a second antenna for communicating with the first antenna;
  a base supporting the chip carrier and the second antenna; and
  a test computer electronically connected to the second antenna, wherein the test computer evaluates functions of the RFID chip by way of the communications between the first antenna and the second antenna.

In another embodiment of the invention, a method for testing radio frequency identification (RFID) chips is provided, comprising:
  providing a plurality of RFID chips to be tested;
  transferring the RFID chips one by one to a test head through a chip transport device, wherein the test head comprises:
    a chip carrier for carrying the RFID chip, the chip carrier having a first antenna for electronically connecting to the RFID chip; and
    a second antenna for communicating with the first antenna;
  providing a test computer electronically connected to the second antenna; and
  evaluating functions of the RFID chip using the test computer.

DETAILED DESCRIPTION OF THE INVENTION

The present invention may best be understood by reference to the following description in conjunction with the accompanying drawings, in which similar reference numbers represent similar elements. Any devices, components, materials, and steps described in the embodiments are only for illustration and not intended to limit the scope of the present invention.

Figure 1A:
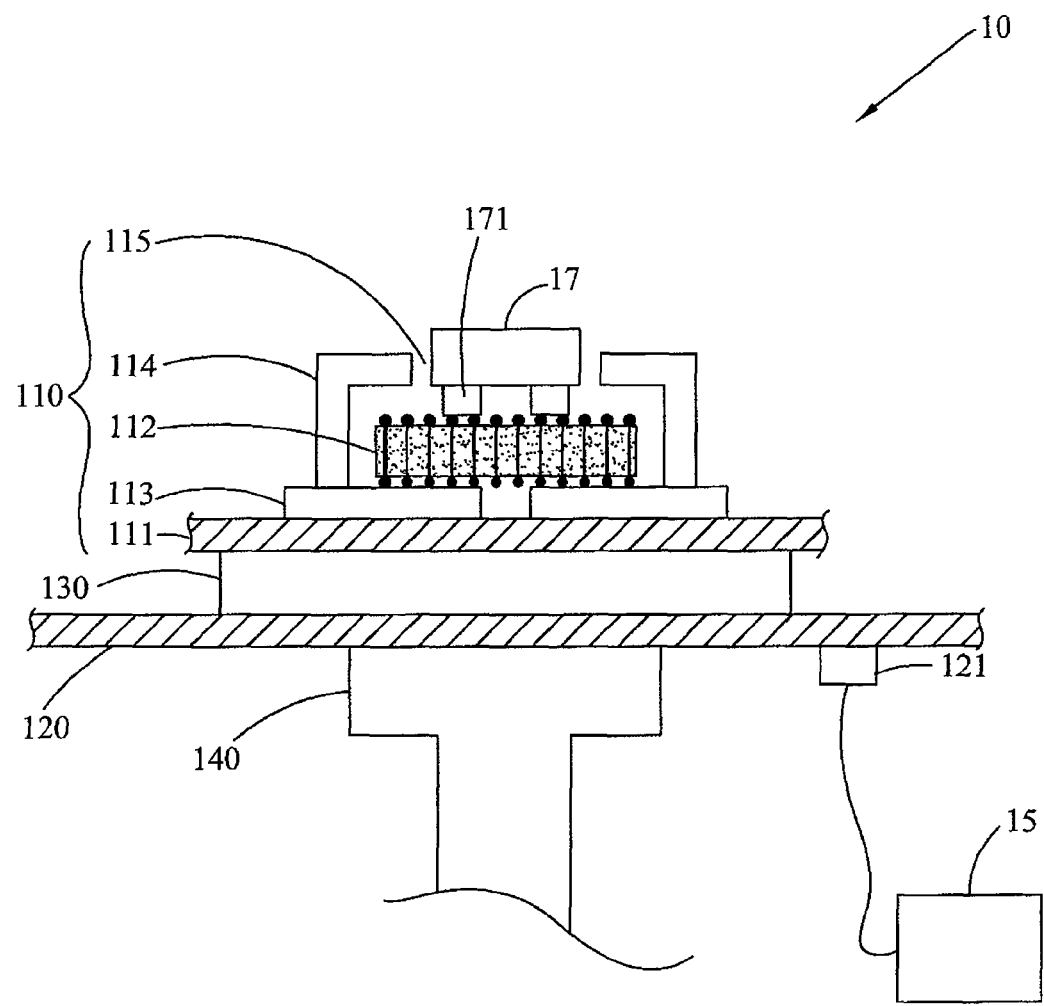
FIG. 1A is a cross-sectional view illustrating a test module for radio frequency identification (RFID) chips in accordance with one embodiment of the present invention.

FIG. 1A is a cross-sectional view illustrating a test module for radio frequency identification (RFID) chips in accordance with one embodiment of the present invention. As shown in FIG. 1A, the test module includes a test head 10 and a test computer 15. The test head 10 includes a chip carrier 110 for carrying a RFID chip 17 to be tested. The chip carrier 110 has a first antenna 111 capable of electronically connecting to the RFID chip 17. The test head 10 further includes a second antenna 120 for communicating with the first antenna 111; an isolation member 130 isolating the first antenna 111 from the second antenna 120; and a base 140 supporting the chip carrier 110, the second antenna 120 and the isolation member 130. The test computer 15 electrically connects to the second antenna 120 via a first electrically conductive terminal 121. The test computer 15 can be a computer containing various test programs. The test computer 15 may transmit a test signal to a second antenna 120. The second antenna 120 then communicates with the first antenna 111, transmitting the test signal to the RFID chip 17. Thereafter, the RFID chip 17 may transmit a response signal back to the first antenna 111, and similarly, the response signal is transmitted to the RFID chip 17 by way of the communications between the first antenna 111 and the second antenna 120. In doing so, the test computer 15 may write data into/read or erase data from the RFID chip 17, so as to evaluate functions thereof.

Referring to FIG. 1A again, the RFID chip 17 is a single chip divided from a wafer, e.g., more preferably, a packed chip with an external connection electrode 171. The chip carrier 110 further includes an elastic connector 112 for electrically connecting the first antenna 111 to the RFID chip 17. As shown, one side of the elastic connector 112 electrically connects the external connection electrode 171 of the RFID chip 17, and the other side thereof electrically connects the first antenna 111 through the second electrically conductive terminal 113. The elastic connector 112 not only makes the electrical connection but also protects the RFID chip 17 from being damaged. The chip carrier 110 also includes a shell 114 enclosing the elastic connector 112. The shell 114 has an opening 115 exposing a portion of the elastic connector 112. The RFID chip 17 is received in the opening 115. In this embodiment, the first antenna 111 and the second antenna 120 are plate-shaped antennas (however, the invention is not limited thereto). Both of them are composed of conductive textures (not shown) capable of emitting/receiving radio signals and blanketed with insulating layers. An RFID tag is formed when the first antenna 111 electrically connects to the RFID chip 17. The simulation of the RFID working system is conducted by matching such an RFID tag with the second antenna 120 connecting a reader (i.e. the test computer 15). It is noted that an isolation member 130 keeps the first antenna 111 apart from the second antenna 120 at a specific distance. Such a specific distance may vary within the effective communication distance between the first antenna 111 and the second antenna 120. The isolation member 130 may be composed of any suitable material.

Figure 1B:
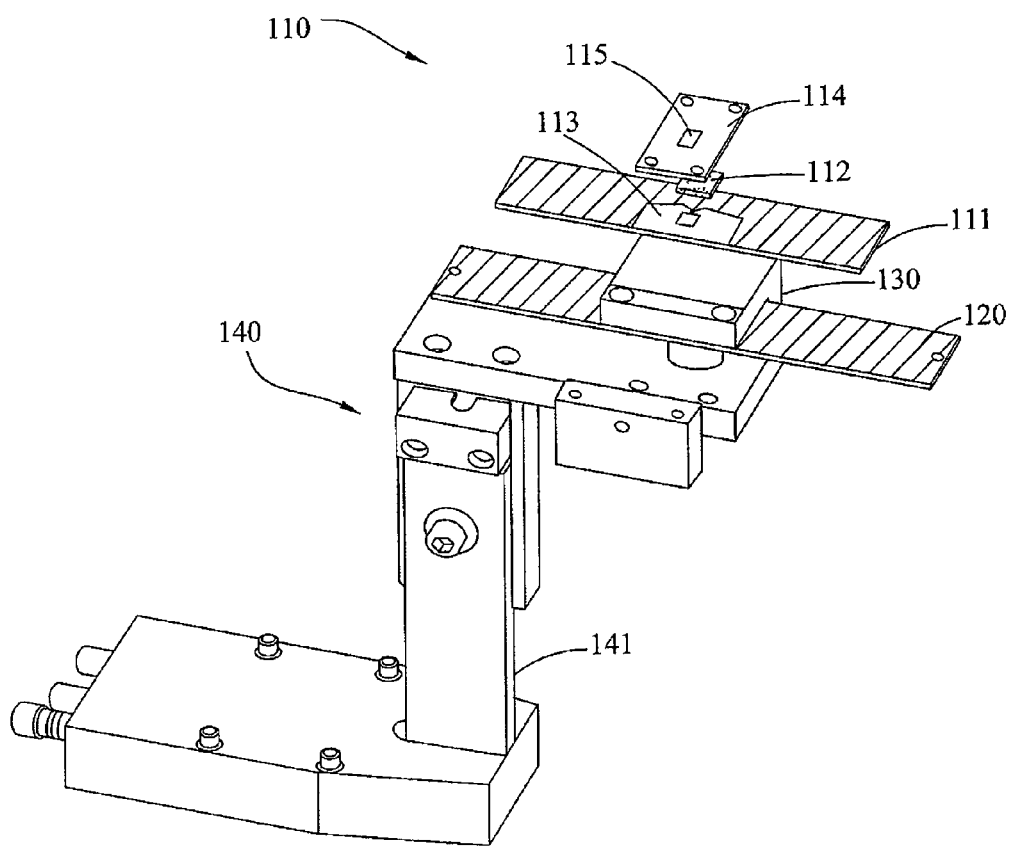
FIG. 1B is an isometric view illustrating a test head for radio frequency identification (RFID) chips in accordance with one embodiment of the present invention.

FIG. 1B is a perspective view illustrating the test head 10 described above. As shown in FIG. 1B, the base 140, supporting the chip carrier 110, the second antenna 120 and the isolation member 130, has a removable long arm 141 capable of adjusting the position of the chip carrier 110. As such, the chip carrier 110 can approach where the RFID chip 17 has been transferred.

Figure 2:
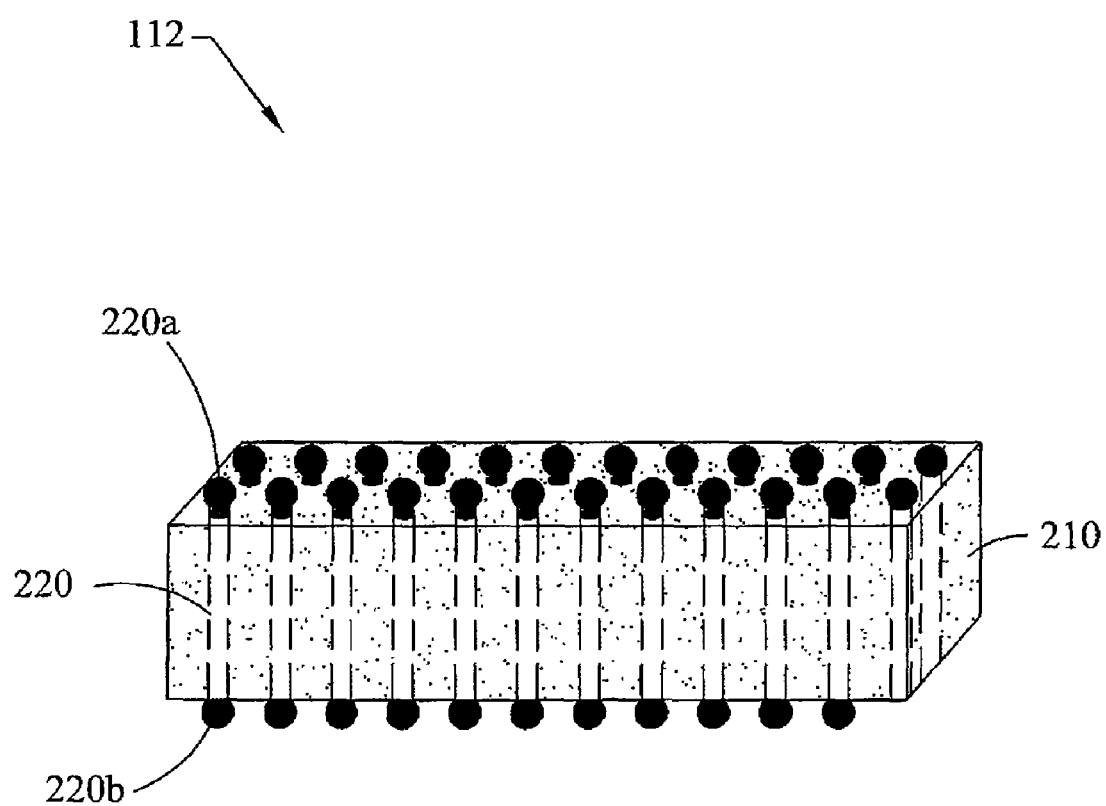
FIG. 2 illustrates an elastic connector in accordance with one embodiment of the present invention.

FIG. 2 is a sketched diagram illustrating a structure of an elastic connector 112 in accordance with one embodiment of the present invention. As shown, the elastic connector 112 includes an elastic carrier 210 and a plurality of metal wires 220 respectively passing through the elastic carrier 210. Each metal wire 220 has two exposed ends 220a and 220b electrically connecting the first antenna 111 and the external connection electrode 171 of the RFID chip 17, respectively. The elastic carrier 210 may be silicone or polyurethane. The metal wires 220 may be uniformly arranged in the elastic carrier 210 with a distance between each other, for example, ranging from 30 μm to 50 μm. Each metal wire 220 has a diameter, for example, ranging between 10 μm and 30 μm.

In addition to the test head 10 and the test computer 15, the test module for RFID chips further includes a chip transport device for transferring the RFID chip 17 to the chip carrier 110. The chip transport device may include a vibration plate and a conveyor belt connecting the vibration plate. The vibration plate transfers the RFID chips 17 one by one to the conveyor belt. Furthermore, the test module for RFID chips may include an image viewer, a redirector, a recharger, a disposal tank, an output tank, etc., that will be described in detail later.

Figure 3:
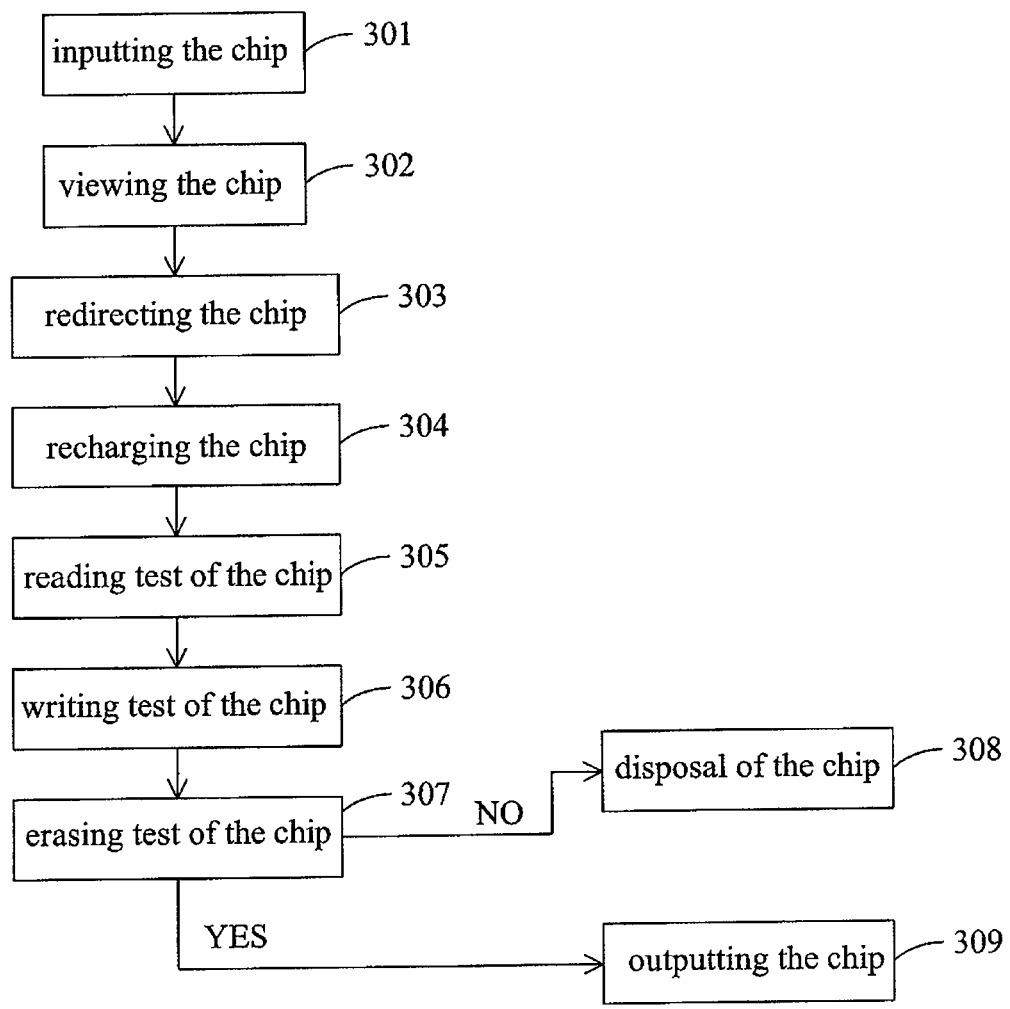
FIG. 3 is a flow chart illustrating an operation method for the test module in accordance with one embodiment of the present invention.

FIG. 3 is a flow chart illustrating an operation method for the test module in accordance with one embodiment of the present invention. As shown in FIG. 3, the operation method may include the following steps, e.g., step 301 for inputting the chip, step 302 for viewing the chip, step 303 for redirecting the chip, step 304 for recharging the chip, step 305 for reading test of the chip, step 306 for writing test of the chip, step 307 for erasing test of the chip, step 308 for disposal of the chip, and step 309 for outputting the chip. In detail, the step 301 includes: providing a plurality of RFID chips 17; providing a chip transport device including a vibration plate and a conveyor belt connecting the vibration plate; and transferring the RFID chips 17 one by one to the conveyor belt utilizing the vibration plate. The step 302 includes: providing an image viewer and a redirector; viewing the RFID chip 17 using the image viewer; and redirecting the RFID chip 17 to a predetermined orientation using the redirector. Sometimes, the RFID chip 17 enters the conveyor belt in the wrong orientation, resulting in the external connection electrode 171 failing to electronically connect the elastic connector 112 of the chip carrier 110 in subsequent steps. In view of this, the image viewer is used to observe whether the external connection electrode 171 is in an appropriate orientation or not. If not, the redirector is employed for redirecting the RFID chip 17 to the appropriate orientation.

Referring to FIG. 3 again, the step 304 that is optional includes: providing the appropriate power to the RFID chip 17. In general, the RFID chip 17 may be an active type chip or a passive type chip. The active type chip has a self-contained power supply. The passive type chip, having no internal power supply, needs an external excitation so as to be read or processed within the effective detection distance of the reader (i.e., the test computer 15). Accordingly, the step 304 will be performed on a passive RFID chip 17. The step 305 includes: transferring the RFID chips 17 one by one to a first test head; and reading data from the RFID chip 17 using the test computer 15. The step 306 includes: transferring the RFID chip 17 a second test head; and writing data into the RFID chip 17 using the test computer 15. The step 307 includes: transferring the RFID chip 17 to a third test head; and erasing data from the RFID chip 7 using the test computer 15. All of the first test head, the second test head and the third test head are similar to the aforementioned test head in structure, employing a vacuum suction head for transferring the RFID chip 17. After completing the step 305 to the step 307, the test computer 15 will show the result as to whether the RFID chip 17 is qualified or not. If disqualified, the RFID chip 17 will be delivered to the disposal tank (such as step 308). If qualified, the RFID chip 17 will be delivered to the output tank (such as step 309). Thereafter, a tape-packing device connected to the output tank will pack the qualified RFID chips 17.

Although specific embodiments have been illustrated and described, it will be obvious to those skilled in the art that various modifications may be made without departing from what is intended to be limited solely by the appended claims.

The invention claimed is:

1. A test module for radio frequency identification (RFID) chips, comprising:
   a chip carrier for carrying a RFID chip to be tested, wherein the chip carrier comprises:
      a first antenna;
      a connector above the first antenna, the connector having a carrier supporting the RFID chip and a plurality of metal wires respectively passing through the carrier so as to electronically connect the first antenna to the RFID chip; and
      a shell enclosing the connector, wherein the shell has an opening exposing a portion of the connector and the RFID chip is received in the opening; and
   a second antenna for communicating with the first antenna;
   a base supporting the chip carrier and the second antenna; and
   a test computer electronically connecting the second antenna, wherein the test computer evaluates functions of the RFID chip by way of the communications between the first antenna and the second antenna, and wherein each metal wire has two exposed ends electrically connecting the first antenna and the RFID chip, respectively, and each metal wire is uniformly arranged in the carrier with a distance from 30 μm to 50 μm between each other.

2. The test module for the RFID chips of claim 1, wherein materials of the carrier comprise silicone or polyurethane.

3. The test module for the RFID chips of claim 1, further comprising:
   an isolation member on the base, isolating the first antenna from the second antenna.

4. The test module for the RFID chips of claim 1, wherein the test computer is used to write data into/read or erase data from the RFID chip.

5. The test module for the RFID chips of claim 1, further comprising:
   a chip transport device for transferring the RFID chip to the chip carrier.

6. The test module for the RFID chips of claim 5, wherein the chip transport device further comprises a vibration plate and a conveyor belt connecting the vibration plate, and wherein the vibration plate transfers the RFID chips to the conveyor belt one by one.

* * * * *